Figure 1:
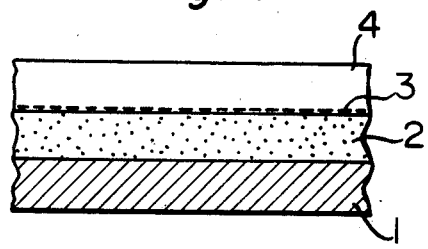

United States Patent [19]

Kuriyama et al.

[11] 4,402,887

[45] Sep. 6, 1983

[54] SHEET-LIKE ARTICLES OF POLYVINYL CHLORIDE

[75] Inventors: Kazuya Kuriyama, Chiba; Shigeru Murakami, Ichihara; Ryozo Sugawara, Sodegawara; Kiyoshi Honda, Hirakata, all of Japan

[73] Assignee: Dainippon Ink and Chemicals Inc., Tokyo, Japan

[21] Appl. No.: 61,858

[22] Filed: Jul. 30, 1979

[30] Foreign Application Priority Data

Mar. 14, 1978 [JP] Japan .................................. 53-28237
Apr. 20, 1979 [JP] Japan .................................. 54-48031

[51] Int. Cl.³ .......................... H05B 1/00; B29D 7/14; C08F 11/00; C08K 5/57
[52] U.S. Cl. .................................... 264/22; 264/175; 204/159.17; 524/178; 427/54.1
[58] Field of Search ............... 428/913, 463, 159, 482, 428/522, 904; 427/43.1, 53.1, 54.1, 56.1; 430/306, 907, 917, 912; 524/178, 179

[56] References Cited

U.S. PATENT DOCUMENTS

| 2,945,795 | 7/1960 | Cummin |
| 3,365,353 | 1/1968 | Witman |
| 3,516,828 | 6/1970 | Floss et al. ........................... 430/283 |
| 3,542,661 | 11/1970 | Klopfer et al. ................. 204/159.17 |
| 3,764,324 | 10/1973 | Reyes ................................... 430/306 |
| 3,852,177 | 12/1974 | Atchison et al. .............. 204/159.17 |
| 3,924,023 | 12/1975 | Boranian et al. ................... 427/54.1 |
| 3,928,704 | 12/1975 | Heidingsteld et al. ............. 428/904 |
| 3,943,082 | 3/1976 | Smith et al. ......................... 428/522 |
| 3,953,650 | 4/1976 | Sauer et al. ......................... 428/522 |
| 3,998,715 | 12/1976 | Bohm et al. ..................... 204/159.17 |
| 4,010,221 | 3/1977 | Gephart et al. ...................... 428/482 |
| 4,100,318 | 7/1978 | McCann et al. ..................... 428/159 |
| 4,113,894 | 9/1978 | Koch ................................... 427/54.1 |
| 4,121,016 | 10/1978 | Garrison Jr. ......................... 524/178 |
| 4,124,431 | 11/1978 | Schramer et al. .................. 428/522 |
| 4,131,716 | 12/1978 | Bertozzi ............................. 427/54.1 |
| 4,151,132 | 4/1979 | Khanna ............................... 524/178 |
| 4,157,261 | 6/1979 | Takeda ............................... 430/907 |
| 4,168,249 | 9/1979 | Meyer ................................. 428/522 |
| 4,169,005 | 9/1979 | Fogle et al. ....................... 427/54.1 |
| 4,180,447 | 12/1979 | Sencar ............................ 204/159.17 |
| 4,180,615 | 12/1979 | Bettoli ............................... 427/54.1 |
| 4,187,159 | 2/1980 | Goswami et al. .............. 204/159.17 |
| 4,228,232 | 10/1980 | Rousseau ............................ 430/306 |
| 4,245,030 | 1/1981 | Faust et al. ......................... 430/912 |
| 4,304,838 | 12/1981 | Haneydena et al. ................ 430/907 |

FOREIGN PATENT DOCUMENTS 51-7051 1/1976 Japan .................................... 524/178

OTHER PUBLICATIONS

Miller, Radiation-Cross Linking of Plasticized Poly (vinyl chloride), vol. 51, No. 10 Oct. 1959 1271-1274.

Primary Examiner—William R. Dixon, Jr.
Attorney, Agent, or Firm—Sherman & Shalloway

[57] ABSTRACT

A sheet-like article of polyvinyl chloride which is obtained by calendering a composition comprising polyvinyl chloride, a reactive plasticizer, a photosensitizer, a stabilizer and a polymerization inhibitor, and then irradiating the product with ultraviolet rays.

5 Claims, 9 Drawing Figures

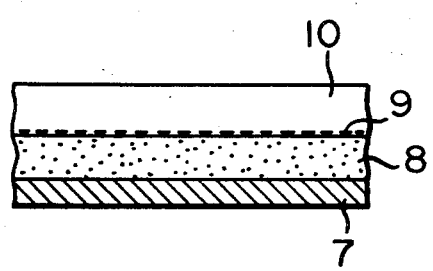
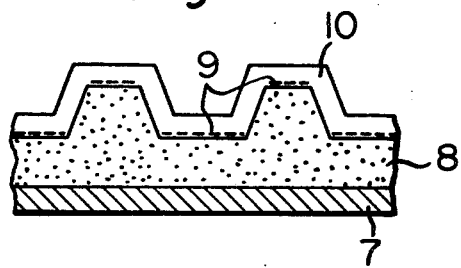
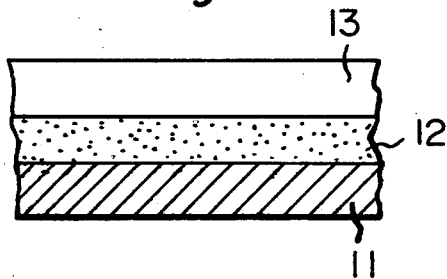
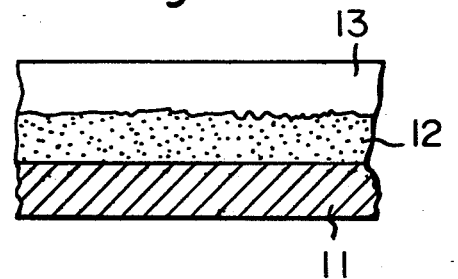

SHEET-LIKE ARTICLES OF POLYVINYL CHLORIDE

This invention relates to sheet-like articles from ultraviolet-curing polyvinyl chloride compositions. More specifically, the invention concerns sheet-like polyvinyl chloride articles obtained by calendering compositions comprising polyvinyl chloride, reactive plasticizers, photosensitizers, stabilizers and polymerization inhibitors, and exposing the product to ultraviolet rays.

Polyvinyl chloride (to be referred to as PVC) is usually given shape by such means under heat as calendering, extrusion, or injection molding, and finds a wide variety of applications as films, sheets, belts, electrical wires, etc. In recent years, improvement of the heat resistance and mechanical strength of PVC articles has been demanded. To meet the demand, it has been considered to raise the average degree of polymerization of PVC, to use higher plasticizers such as trimellitic ester or polyester plasticizers, or to crosslink PVC with electron radiations, and these methods have been put to practical use. It is also being considered to irradiate shaped articles from PVC compositions containing reactive plasticizers with electron rays or radioactive rays or heat them in the presence of radical generators such as organic peroxides to cause cross-linking and curing thereby increasing their heat resistance and mechanical strength. Such crosslinked and cured articles from PVC compositions containing reactive plasticizers are superior in heat distortion resistance, cigarette resistance (i.e. the property of the article in the form of a sheet that when a burning cigarette laid on the sheet is put out under foot, the surface of the sheet undergoes little breakage by heat or little adhesion of the ashes of the cigarette), and mechanical strengths such as hardness and tensile strength. Therefore, those articles are drawing attention to their application as top coats of floor coverings.

The crosslinking by irradiation of electron rays or radioactive rays, however, involves complicated equipments and much cost, and is unsuitable for application to sheet-like articles having a large width that are obtained by calendering. The method comprising heating articles containing radical generators, on the other hand, requires low cost and simple equipments, but faces the problem that in calendering the fluidity of the composition decreases with the progress of the crosslinking reaction upon heating, thus making its shaping difficult or impossible. Further, if a PVC composition containing a reactive plasticizer is subjected to calendering, a crosslinked gel occurs owing to the heat or shear during the procedure, whereupon hard spots appear in the surface of the product and in many cases a product having a uniform texture is not obtained; or in some cases, the calendering procedure itself becomes difficult.

The object of the present invention is to provide sheet-like PVC articles having superior heat resistance and mechanical strengths, having a transparent, uniform texture, and free from the above-described drawbacks.

The present inventors have found that said object of the present invention can be attained by uniformly calendering a composition comprising PVC, a reactive plasticizer, a photosensitizer, a stabilizer and a polymerization inhibitor without gelling the reactive plasticizer, and then irradiating the product with ultraviolet rays to cause the reaction of the reactive plasticizer.

Thus, a sheet-like article the present invention is aimed at can be obtained by calendering under heat a composition comprising (1) PVC, (2) a reactive plasticizer, particularly, a plasticizer having at least two polymerizable unsaturated bonds, (3) a photosensitizer, (4) a stabilizer, particularly, a tin compound or a phosphorous acid ester, and (5) a polymerization inhibitor, without causing a substantial reaction of the reactive plasticizer, and then irradiating the resulting product with ultraviolet radiations to cause the reaction of the reactive plasticizer.

PVC as used in the present invention refers to a homopolymer of vinyl chloride having an average degree of polymerization of 500 to 4,000, a copolymer of vinyl chloride with at least one of copolymerizable comonomers such as vinyl acetate, acrylonitrile, styrene, (meth)acrylate ester, ethylene, propylene, or butylene, said copolymer having an average degree of polymerization of 500 to 4,000, or a mixture of these.

In the present invention, such PVC can be used in combination with another polymer, which may be anything compatible with PVC, but preferably, an elastomer which can impart flexibility to the composition to be prepared. Examples of the elastomer include natural rubber; synthetic rubbers such as nitrile rubber, styrene-butadiene rubber, acrylonitrile-butadiene rubber, chloroprene rubber, or acrylic rubber; chlorinated polyethylene; ethylene-vinyl acetate copolymer; and ethylene-vinyl acetate-vinyl chloride graft copolymer. If the elastomer is blended with PVC, its amount is 1 to 30 parts by weight (to be referred to as parts for short), preferably, 3 to 10 parts, per 100 parts of PVC.

The reactive plasticizer in the present invention must be the one having at least two polymerizable unsaturated bonds and capable of plasticizing PVC before its crosslinking and curing. That reactive plasticizer itself has been well known because it has hitherto been blended with PVC. The suitable reactive plasticizer has a molecular weight of 200 to 10,000, preferably, 300 to 4,000. The most preferable reactive plasticizer has high compatibility with PVC and has a molecular weight of 300 to 1,000 because of its capability of causing the crosslinking reaction more smoothly during irradiation by ultraviolet rays.

Specific examples of the reactive plasticizer include polyfunctional acrylic monomers obtained from acrylic or methacrylic acid and aliphatic polyhydric alcohols such as ethylene glycol, butylene glycol, 1,6-hexanediol, propylene glycol, neopentyl glycol, polyethylene glycol, polypropylene glycol, trimethylolpropane, trimethylolethane, or glycerol;

aliphatic unsaturated allyl esters such as diallyl maleate or diallyl itaconate;

epoxy acrylates obtained from epoxidized soybean oil and unsaturated acids such as acrylic acid or methacrylic acid;

unsaturated polyesters;

polyfunctional acrylic oligomers obtained from acrylic or methacrylic acid and alkylene oxide adducts of bisphenol A or bisphenol F, e.g., polyfunctional acrylic oligomers expressed by the formula

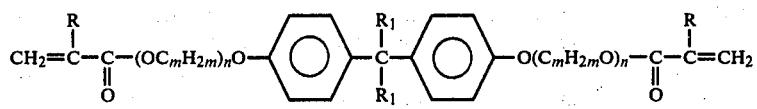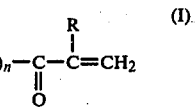 (I)

wherein R and R₁ each represent a hydrogen atom or a methyl group, and m and n denote an integer of 2 to 4 and an integer of 1 to 10, respectively;

polyfunctional acrylic oligomers obtained from acrylic or methacrylic acid and alkylene oxide adducts of phenolic novolaks, e.g., polyfunctional acrylic oligomers of the formula

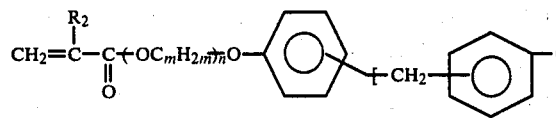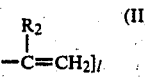 (II)

wherein $R_2$ represents a hydrogen atom or a methyl group, m is an integer of 2 to 4, n is an integer of 1 to 10, and l is an integer of 0 to 20;

polyfunctional acrylic oligomers obtained from polyhydric alcohols such as butylene glycol, trimethylolpropane or pentaerythritol, and aromatic monocarboxylic acids such as benzoic acid or para-tert.butylbenzoic acid, and acrylic or methacrylic acid, e.g., polyfunctional acrylic oligomers of the formula

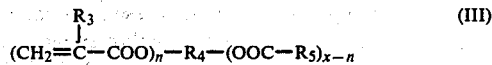 (III)

wherein $R_3$ is a hydrogen atom or a methyl group; $R_4$ is an alcohol residue having 2 to 10 carbon atoms and a valence of at least 2, or a polyether polyol residue formed by the addition of an alkylene oxide having 2 to 4 carbon atoms to said alcohol; $R_5$ is a phenyl group substituted with an alkyl group having 1 to 10 carbon atoms, or an unsubstituted phenyl group; n is a number ranging from 0.1 to 5.9 on the average; and x is an integer of at least 2, x-n being always greater than 1;

polyfunctional acrylic oligomers obtained from aromatic dibasic acids such as phthalic anhydride, isophthalic acid, or terephthalic acid, and if desired, small amounts of aromatic polybasic acids such as trimellitic anhydride or trimesic acid, glycols such as ethylene glycol, propylene glycol, butylene glycol, pentanediol, hexanediol, or octanediol, and unsaturated monobasic acids such as acrylic acid or methacrylic acid, e.g., polyfunctional acrylic oligomers of the formula

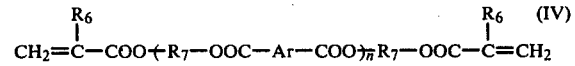 (IV)

wherein $R_6$ represents a hydrogen atom or a methyl group, $R_7$ represents an alkylene group having 2 to 10 carbon atoms, n is an integer of 1 to 10, and Ar denotes a divalent aromatic group;

polyfunctional acrylic oligomers obtained from aromatic diisocyanates such as tolylene diisocyanate, xylylene diisocyanate, or diphenylmethane-4,4'-diisocyanate, glycols such as ethylene glycol, butylene glycol, hexanediol or octanediol, and if desired, polyether polyols formed by the addition of alkylene oxides having 2 to 4 carbon atoms to alcohols having 2 to 10 carbon atoms and having a valence of at least 2, and hydroxy acrylates such as 2-hydroxyethyl methacrylate, 2-hydroxyethyl acrylate, 2-hydroxypropyl methacrylate, or 2-hydroxypropyl acrylate, e.g., polyfunctional acrylic oligomers of the formula

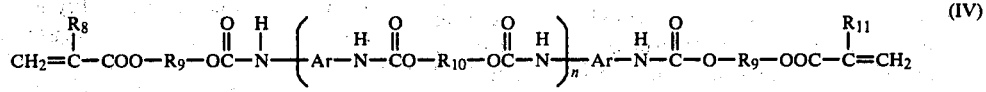 (IV)

wherein $R_8$ and $R_{11}$ each represent a hydrogen atom or a methyl group, $R_9$ represents an alkylene group having 2 to 3 carbon atoms, $R_{10}$ represents an alkylene group having 2 to 10 carbon atoms, or a polyethylene glycol or polypropylene glycol residue having a molecular weight of 200 to 10,000, n is an integer of 0 to 10, and Ar is an aromatic group;

and aromatic unsaturated esters such as diallyl phthalate, triallyl trimellitate, or trimethallyl trimellitate.

Of the above-mentioned reactive plasticizers, those having at least one aromatic ring in the molecule are preferred, because they will better the effect of preventing the discoloration of sheet-like articles to be formed. The reactive plasticizers obtained by using methacrylic acid are also preferred because they will similarly improve the heat resistance of the sheet-like articles. The most preferable reactive plasticizers are those having at least one aromatic ring in the molecule and obtained by using methacrylic acid. To impart flexibility to sheet-like articles, compounds having one polymerizable unsaturated bond and compatible with PVC may be used together with the reactive plasticizers. The amount of that compound used must be restricted to a range which will not affect the heat resistance of the composition. Concretely, the preferred amount is 30% by weight or less based on the total amount of the reactive plasticizer.

The photosensitizer used in the present invention causes the crosslinking reaction of the reactive plasticizer upon excitation by ultraviolet irradiation. Examples of the photosensitizer include benzoyl acenapthene, α-methylbenzoyl, α-allylbenzoyl, benzoin methyl ether, benzoin isopropyl ether, benzoin-sec-butyl ether, acetophenone, benzophenone, p-bromobenzophenone, 4,4'-tetramethyldiaminobenzophenone, diphenyl disulfide, tetraethylthiuram disulfide, decylallyl sulfide, decyl thiobenzoate, benzylacetyl, uranyl nitrate, Eosine and Thionine. Of these compounds, the benzoin compounds are preferred, and benzoin isopropyl ether is particularly preferred. These photosensitizers exhibit greater effects when used jointly with aromatic nitro compounds such as trinitroaniline, nitronaphthalene, 5-nitroacenaphthene, 2-nitrofluorene, or picramide; quinones such as naphthoquinone, anthraquinone, or 2,3-diphenylanthraquinone; anthrone; or pyrylium salts.

The stabilizer usable in the present invention may be the one usually blended with PVC. Its examples include lead compounds such as white lead, tribasic lead sulfate, tribasic maleate, or lead silicate; metalic soaps of metals such as lead, cadmium, barium, zinc or calcium with acids such as stearic acid, lauric acid, ricinoleic acid or naphthenic acid; tin type stabilizers to be described below; and phosphorous esters. Particularly preferred are tin type stabilizers and phosphorous esters. Joint use of these stabilizers and non-coloring antioxidants will afford better effects.

The tin type stabilizers are compounds expressed by the general formula $R'_pSnY_{4-p}$ wherein $R'$ represents an alkyl group having 1 to 8 carbon atoms, namely, a methyl, ethyl, propyl, butyl, heptyl, hexyl, pentyl or octyl group, Y represents a monovalent residue of lauric acid, maleic acid or a mercaptan compound, and p denotes an integer of 1 to 3. Specific examples of the tin type stabilizers are monobutyltin trimethylmaleate, monobutyltin trioctylmaleate, dibutyltin dilaurate, dibutyltin laurate methylmaleate, dibutyltin dioleylmaleate, dibutyltin dimethyl maleate, dibutyltin maleate, dibutyltin methoxymethylmaleate, dibutyltin dioctylmaleate, methyltin sulfide, n-butyltin sulfide, n-octyltin sulfide, methyltin tris(n-octylthioglycolate), n-butyltin tris(isooctylthioglycolate), n-butyltin tris(3,4,5-trimethylthiomaleate), n-octyltin tris(cyclohexyl-3-mercaptopropionate), ethyltin tris(ethyl-2-mercaptomyristate), isopropyltin tris(methoxyethyl-3-mercaptopropionate), n-propyltin tris(methyl-2-mercaptobenzoate), methyltin trisoctylmercaptide, isoamyltin tris(tetrahydrofurfuryl-3-mercaptopropionate), mono-n-butyltin monoisooctyl-thioglycolate sulfide, mono-n-octyltin monocyclohex-ylthioglycolate, sulfide, dimethyltin bis(isooctylthio-glycolate), dibutyltin bis(isooctylglycolate), and di-n-octyltin bis(isooctylthioglycolate). The tin type stabilizers of the mercaptide type, such as dimethyltin bis-(isooctylthioglycolate) or dibutyltin bis(isooctylthio-glycolate), in particular, are the most effective to prevent coloration during heating. Many of other metallic soaps and lead compounds cannot be used as the stabilizer because they decrease transparency and other effects, but those which do not involve such decrease in effects can be course to used.

The aforesaid phosphorous esters include, for instance, diphenyl isooctyl phosphite, tridecyl phosphite, didecyl phenyl phosphite, diphenyl nonylphenyl phosphite, diphenyl isodecyl phosphite, trimethyl phosphite, tricresyl phosphite, triphenyl phosphite, tris(nonylphenyl)phosphite, triisooctyl phosphite, trilauryl phosphite, triisodecyl phosphite, trioctadecyl phosphite, trilauryl trithiophosphite, trischloroethyl phosphite, and dibutyl hydrodiene phosphite.

The aforementioned non-coloring antioxidants refer to antioxidants which are in wide use but which are colorless and do not color PVC. The most general examples are phenolic antioxidants, e.g., hydroquinone compounds such as 2,5-di-(t-amyl)hydroquinone, 2,5-di-(t-butyl)hydroquinone, or hydroquinone monomethyl ether; monophenolic compounds such as 1-oxy-3-methyl-4-isopropylbenzene, 2,6-di-t-butylphenol, 2,6-di-t-butyl-4-ethylphenol, 2,6-di-t-butyl-4-methylphenol, or 2,6-di-t-butyl-4-n-butylphenol; bis-, tris- and polyphenolic compounds such as 4,4'-dihydroxydiphenyl, 2,2-methylene-bis(4-methyl-6-cyclohexylphenol), 2,2'-methylene-bis-(6-α-methyl-benzyl-p-cresol), 1,1-bis-(4-hydroxyphenyl)cyclohexane, hindered bisphenol, or tris-(2-methyl-4-hydroxy-5-t-butylphenyl)butane; and thiobisphenolic compounds such as 4,4'-thiobis-(6-t-butyl-4-methylphenol). Amine type anti-oxidants such as N,N'-di-o-tolylethylenediamine or N,N'-di-2-naphthyl-p-phenylenediamine are also usable preferably. Other antioxidants which can be used include, for example, dilauryl thiodipropionate, distearyl thiodipropionate, distearyl-$\beta,\beta'$-thiodibutyrate, 2-mercaptobenzimidazole, tris(nonylphenyl)-phosphite, tris(mono- and di-nonylphenyl) phosphite, and alkylallyl phosphites.

Said tin type stabilizers, phosphorous esters and non-coloring antioxidants can be used singly or in combination with each other. Most preferably, the tin type stabilizers are used.

The composition of the present invention contains, in addition to the aforementioned components, a polymerization inhibitor which does not gel the reactive plasticizer during calendering and which does not impede crosslinking reaction during irradiation with ultraviolet rays. Examples of the polymerization inhibitor include those which are usually employed, such as hydroquinone, benzoquinone, phenothiazine, hydroquinone monomethyl ether, t-butylhydroquinone, and methylhydroquinone. Particularly when colorlessness and transparency are required of the resulting sheet-like article, hydroquinone is preferred. If desired, the composition of the present invention may further contain dyes, non-reactive plasticizers, etc. The non-reactive plasticizer, e.g., dioctyl phthalate, dibutyl phthalate, dibutyl lauryl phthalate, or diheptyl phthalate, can impart flexibility to the sheet-like article and prevent discoloration due to irradiation with ultraviolet rays. The non-reactive plasticizer, however, has a tendency to lower the cigarette resistance if it is used in a large amount. Its amount, therefore, should better be not too large, and usually, is 1 to 30 parts per 100 parts of PVC.

The aforesaid reactive plasticizer in the composition of the present invention may be in any amount which enables the effects of the present invention to be achieved and which is usually 3 to 7 parts, preferably 10 to 50 parts, per 100 parts of PVC. If the amount of the reactive plasticizer is less than 3 parts, the resulting sheet-like article after curing has insufficient heat resistance. If its amount exceeds 70 parts, the tendency is observed that the article is too rigid.

The content of the photosensitizer in the composition of the present invention has relation to the amount of the reactive plasticizer, and usually, is 0.001 to 10% by weight based on the weight of the reactive plasticizer. Of course, its content deviating this range is permissible, if the effects of the present invention can be achieved thereby.

The stabilizer in the composition of the present invention, especially, the tin type stabilizer, phosphorous ester or non-coloring antioxidant, is usually in an amount of 0.05 to 5 parts, preferably 0.5 to 3 parts, per 100 parts of PVC. This range is obeyed even when two or more of the stabilizers are used in combination. If the amount of the stabilizer is less than 0.05 part, its effect of preventing or obviating the discoloration of the composition being heat-treated is not achieved. If the amount is more than 5 parts, the adhesion of the composition to the shaping machine increases. When the PVC composition has great adhesion, its adhesion can be decreased by adding 0.1 to 1 part, per 100 parts of PVC, of a known lubricant such as a higher alcohol, stearic acid, glycerol monostearate, ethylenebisstearoamide, polyethylene glycol, liquid paraffin, or polyethylene wax.

The amount of the polymerization inhibitor in the composition of the present invention is related to the amount of the reactive plasticizer, and usually, is 0.01 to 10% by weight, preferably 0.1 to 2% by weight, based on the weight of the reactive plasticizer. If the amount of the polymerization inhibitor is less than 0.01% by weight, gelation of the reactive plasticizer occurs during calendering, whereas if its amount is more than 10% by weight, the reactive plasticizer is cured insufficiently upon irradiation with ultraviolet rays, thus making unsatisfactory the heat resistance and mechanical strength of the resulting sheet.

According to the present invention, the aforesaid PVC, reactive plasticizer, photosensitizer, stabilizer and polymerization inhibitor are mixed by an ordinary mixing machine, and then calendered usually on four rolls at a speed of 20 to 200 m/minute, preferably 50 to 150 m/minute, with heating. The heating temperature of the calendering is related to the amount of the reactive plasticizer blended. Usually, the temperature is 160° to 190° C. when the amount of the plasticizer is less than 30 parts per 100 part of PVC; it is 150° to 165° C. when the amount of the plasticizer is 30 to 70 parts per 100 parts of PVC. Of course, the temperature outside this range can be employed depending on other calendering conditions. The calendering speed is also affected by the amount of the reactive plasticizer blended; for instance, when the amount of the plasticizer is less than 10 parts (hard composition), the most preferable calendering speed is 20 to 60 m/minute, while when the amount is 10 to 70 parts (soft composition), that speed is 60 to 120 m/minute.

The thickness of the sheet formed by the calendering is usually 0.05 to 1 mm, preferably 0.1 to 0.4 mm. The sheet thickness less than 0.05 mm is not expected to give increased heat resistance; the thickness in excess of 1 mm has a tendency to result in poor degree of curing upon irradiation with ultraviolet rays. The width of the sheet is not critical, but usually, is about 1 to 2 m.

The sheet-like article of the present invention obtained by curing upon ultraviolet irradiation subsequent to calendering is further subjected to fabrication such as press welding whereby the polymerization of the remaining double bonds of the reactive plasticizer proceeds to increase the degree of the crosslinking and curing. Heating in this case is performed particularly effectively at a temperature of 150° C. or higher.

Since the sheet-like article of the present invention has been cross-linked and cured as mentioned above, it has superior surface hardness, less change in color, and good transparency, high wear resistance, and high cigarette resistance. The reason why the sheet-like article of the present invention has such excellent properties is not fully clear, but it is considered to be that the reactive plasticizer is polymerized and simultaneously cross-linked upon ultraviolet irradiation to form a network structure into whose nets PVC is uniformly packed. The PVC composition of the present invention can be applied to the heat-shaping fields where the use of reactive plasticizers has so far been restricted, and thus, its commercial value is very high. For example, the sheet of the present invention from said composition is laminated as a top coating onto a flooring, especially a decorative flooring, to give a beautiful floor covering having excellent cigarette resistance. Said sheet is also suitable as a wall covering, synthetic leather, heat resistant hose, oil seal, packing, heat resistance electrical wire coating material, or decorative sheet. Of course, it may be put to other uses.

When the sheet-like article of the present invention is to be applied to the production of a decorative flooring, various embodiments are possible. According to one of the embodiments, an undercoat is applied to a substrate having a thickness of 0.3 to 2.0 mm (e.g., PVC sol is coated on the substrate to a thickness of 0.2 to 3.0 mm and half-gelled at 120° C.; or PVC sheet having a thickness of 0.2 to 3 mm is laminated on the substrate with a roll at 150° to 180° C.), followed by imprinting a pattern thereon, or bonding a sheet having a printed pattern thereto, and heat-treating the product at 200° C., and finally, welding the sheet-like article of the present invention onto the product at a temperature of 150° C. to produce a decorative floor covering having excellent cigarette resistance. Another embodiment comprises first applying a blowing agent-containing undercoat on a substrate having a thickness of 0.3 to 2.0 mm (for example, coating a blowing agent-containing PVC sol on the substrate to a thickness of 0.2 to 3.0 mm and half-gelling the coating at 120° C.; or laminating a blowing agent-containing PVC sheet having a thickness of 0.2 to 3 mm on the substrate by means of a roll at 130° to 170° C.), imprinting a pattern on the undercoat, then causing foaming at 200° C., embossing the product and finally welding the sheet-like article of the present invention thereto at 150° C. thereby to afford a decorative floor covering having superior cigarette resistance.

FIGS. 1 to 5 attached hereto show cross-sectional views which concretely illustrate the above embodiments of decorative floor covering production.

FIGS. 6 and 7 are cross-sectional views illustrating wall coverings produced in the above manner; and FIGS. 8 and 9 show cross-sectional views of synthetic leather.

A decorative floor covering as illustrated in FIG. 1 comprises a substrate 1 made of asbestos, glass fiber-filled PVC, hemp felt, cotton fabric, unwoven fabric, PVC, or PVC foam, an undercoat 2 applied on the substrate 1 and formed from PVC, natural rubber, synthetic rubber, ethylene-vinyl acetate copolymer, polyurethane, urea foam, or phenolic foam, a printed layer (or printed sheet) 3 laid on the undercoat 2, and a sheet-like article 4 laminated on the printed layer 3 and prepared in accordance with the present invention.

Figure 2:
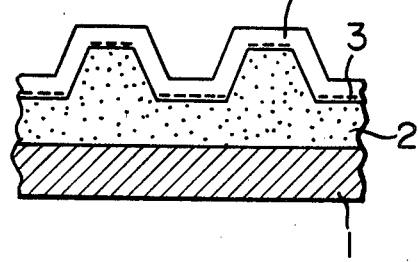

A decorative floor covering as illustrated in FIG. 2 is the same as the decorative floor covering of FIG. 1 except that the undercoat 2 is embossed.

Figure 3:
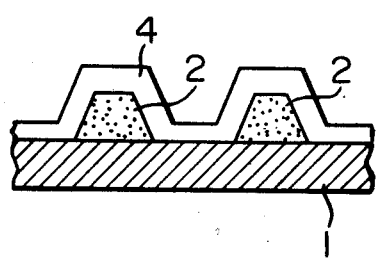

A decorative floor covering as shown in FIG. 3 comprises the substrate 1, the undercoat 2 partially applied thereon, and the sheet-like article 4 of the present invention laminated on the undercoat 2.

Figure 4:
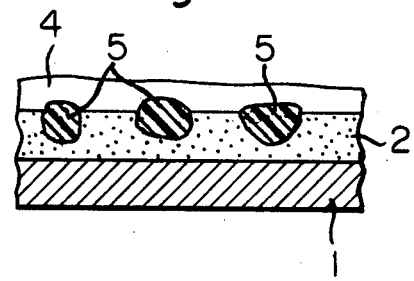

A decorative floor covering as shown in FIG. 4 is composed of the substrate 1, the undercoat 2 applied onto the substrate 1 and containing chips 5 of crosslinked or uncrosslinked PVC, natural rubber, synthetic rubber, ethylene-vinyl acetate copolymer, polyurethane, or cork in such a manner that the chips 5 project partly from the surface of the undercoat 2, and the sheet-like article 4 of the present invention laminated on the undercoat 2.

Figure 5:
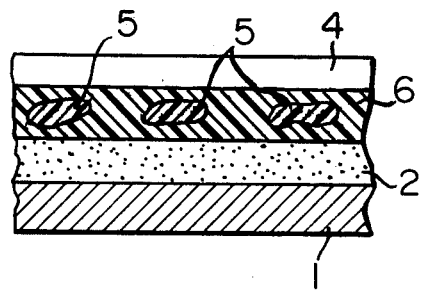

A decorative floor covering as illustrated in FIG. 5 consists of the substrate 1, the undercoat 2 applied thereon, a PVC clear layer 6 containing the chips 5 applied on the undercoat 2, and the sheet-like article 4 of the present invention that is superimposed on the layer 6.

When the sheet-like article of the present invention is to be applied to producing a wall covering, various embodiments can be taken. According to one of the embodiments, an undercoat is applied onto a substrate (for instance, PVC sol is coated on the substrate to a thickness of 0.05 to 0.3 mm and half-gelled at 120° C.). Then, a print pattern is imprinted on the undercoat, or a printed sheet is bonded to the undercoat, followed by heat treatment at 200° C. Finally, the sheet-like article of the present invention is welded to the product at 150° C. to make a wall covering having superior heat resistance. Another embodiment is such that an undercoat is applied onto a substrate (for example, a blowing agent-containing PVC sol is coated on the substrate to a thickness of 0.05 to 0.3 mm and half-gelled at 120° C.) Then, a print pattern is imprinted thereon, or a printed sheet is bonded thereto. Thereafter, foaming is caused at 200° C., and the product is embossed. Finally, the sheet-like article of the present invention is welded onto the product at 150° C. thereby to prepare a wall covering having superior heat resistance.

A wall covering as illustrated in FIG. 6 comprises a substrate 7 made of paper, PVC sheet, polywood, cloth, or asbestos, an undercoat 8 applied onto the substrate 7 and prepared from PVC, natural rubber, synthetic rubber, ethylenevinyl acetate copolymer, polyurethane, urea foam, or phenolic foam, a printed layer (or a printed sheet) 9 laid on the undercoat 8, and the sheet-like article 10 of the present invention laminated on the printed layer 9.

A wall covering 10 as illustrated in FIG. 7 comprises the substrate 7, the foamed or unfoamed, embossed undercoat 8 applied onto the substrate 7, the printed layer 9 laid thereon, and the sheet-like article 10 of the present invention laminated on the printed layer 9.

When the sheet-like article of the present invention is to be applied to the production of synthetic leather, the following various embodiments are possible:

(1) A cloth is coated with an undercoat (for example, A PVC sol containing or not containing a blowing agent is coated on the cloth to a thickness of 0.2 to 3.0 mm, and gelled at 200° C., or foamed and simultaneously gelled if the blowing agent has been incorporated in the sol). Then, the sheet-like article of the present invention is laminated on the undercoat with a roll at 150° to 180° C. to obtain synthetic leather having superior heat resistance.

(2) A cloth is coated with an undercoat (for instance, a PVC sol containing or not containing a blowing agent is coated on the cloth to a thickness of 0.2 to 3.0 mm, and gelled at 200° C., or gelled and simultaneously foamed when the sol contains the blowing agent), followed by graining. Then, the sheet-like article of the present invention is welded onto the product with a roll at 150° to 180° C. to obtain synthetic leather having superior heat resistance.

(3) A cloth is coated with an undercoat (for instance, the sheet-like article of the present invention containing a blowing agent and having a thickness of 0.1 to 1 mm is laminated on the cloth by means of a roll at 150° to 180° C.) Then, the sheet-like article of the present invention is again laminated on the laminate by means of a roll, and the resulting product is passed through an oven at 190° To 220° C. for foaming to obtain synthetic leather having superior heat resistance.

(4) An undercoat is applied on a cloth (for example, a blowing agent-free PVC sheet having a thickness of 0.1 to 1 mm is laminated on the cloth by means of a roll at 150° to 180° C.), followed by further laminating the sheet-like article of the present invention on the laminate by means of a roll, thereby obtaining synthetic leather having superior heat resistance.

(5) The sheet-like article of the present invention is laminated on a cloth by means of a roll at 150° to 180° C. to obtain synthetic leather having superior heat resistance.

Synthetic leather as illustrated in FIG. 8 comprises a cloth 11, an ungrained, foamed or unfoamed, PVC undercoat 12 applied onto the cloth 11, and the sheet-like article 13 of the present invention laminated on the undercoat 12.

Synthetic leather as shown in FIG. 9 comprises a cloth 11, a grained, foamed or unfoamed, PVC undercoat 12 applied onto the cloth 11, and the sheet-like article 13 of the present invention laminated on the undercoat 12.

When the sheet-like article of the present invention is to be applied to producing a decorative sheet, various embodiments are possible.

According to a typical embodiment, an adhesive such as a vinyl acetate resin emulsion, an acrylic resin emulsion, a synthetic rubber latex, an unsaturated polyester or an epoxy resin is coated on a plywood; a sheet with a printed pattern is laid on the coating; the sheet-like article of the present invention is welded onto the sheet at 150° C. and then, press-bonded to the plywood; and finally, the laminate is irradiated with ultraviolet rays to obtain a decorative plywood.

Another embodiment involves the above-described method wherein the sheet-like article of the present invention which has previously been irradiated with ultraviolet rays is welded to the sheet at 150° C. and press-bonded to the plywood, thereby to obtain a decorative plywood.

A decorative plywood as obtained in such a manner is used as a cabinet of a stero set, television set or the like or for furniture.

The present invention is described in greater detail with reference to the following Examples and Comparative Examples, but it is in no way restricted to these examples. Parts in the examples are parts by weight.

EXAMPLES 1 TO 20 AND COMPARATIVE EXAMPLES 1 TO 4

Each of the blends shown in Table 1 was put in a supermixer, and stirred therein for 20 minutes at a rotational speed of 1,000 r.p.m. to obtain a powdery mixture. The mixture was kneaded for 3 minutes at 120° C. in a Banbury mixer having rotors rotating at a ratio of 30:35 per minute, and was further kneaded for 5 minutes at 150° C. on two 18"×50" rolls. The kneaded product was passed on four 18"×48" inverted L calender rolls to form a sheet 0.3 mm thick and 1.0 m wide at a calendering temperature of 185° C. and a calendering speed of 60 m/minute. The resulting sheet was irradiated with ultraviolet rays from a high-pressure mercury lamp device consisting of 5 ultraviolet lamps having 80 W/cm while the sheet was being transferred at a belt speed of 20 m/minute at a distance of 15 cm from the light source. There was thus obtained a transparent and uniformly textured sheet-like composition. The properties of the composition are shown in Table 1.

TABLE 1

| | Examples | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Components (part by weight) | | | | | | | | | | | | |
| PVC ($\bar{P}$ = 1050)[1] | 100 | 100 | 100 | 100 | 100 | 100 | 100 | 100 | 100 | 100 | 100 | 100 |
| Ethylene-vinyl acetate copolymer[2] | | | | | | | | | | | | |
| DOP | | | | | | | | | | | | |
| Reactive plasticizer | | | | | | | | | | | | |
| Trimethylolpropane mono-benzoate diacrylate | 50 | | | | | | | | | | | |
| Trimethylolpropane mono-benzoate dimethacrylate | | 50 | | | | | | | | | | |
| Bisacryloyl oxyethylene phthalate | | | 50 | | | | | | | | | |
| Bismethacryloyl oxyethylene phthalate | | | | 50 | | | | | | | | |
| 2,2-Bis(4-methacryloxydiethoxyphenyl)propane | | | | | 50 | | | | | | | |
| Diallyl phthalate | | | | | | 50 | | | | | | |
| Urethane acrylate[3] | | | | | | | 50 | | | | | |
| Trimethylolpropane triacrylate | | | | | | | | 50 | | | | |
| Trimethylolpropane trimethacrylate | | | | | | | | | | 50 | 50 | 50 |
| Neopentyl glycol dimethacrylate | | | | | | | | | 50 | | | |
| Components (part by weight) | | | | | | | | | | | | |
| Photosensitizer | | | | | | | | | | | | |
| Benzoin isopropyl ether | 0.3 | 0.3 | | | 0.3 | 0.3 | 0.3 | 0.3 | 0.3 | | 0.3 | 0.3 |
| Benzoin methyl ether | | | 0.3 | 0.3 | | | | | | 0.3 | | |
| Polymerization inhibitor | | | | | | | | | | | | |
| Hydroquinone | 2.0 | 2.0 | | | 0.01 | 0.01 | 0.2 | 0.1 | 0.1 | 0.1 | 0.1 | 0.1 |
| t-Butylhydroquinone | | | 1.0 | 1.0 | | | | | | | | |
| Stabilizer | | | | | | | | | | | | |
| Cadmium stearate | 1.0 | 1.0 | 1.0 | 1.0 | 1.0 | 1.0 | 1.0 | 1.0 | 1.0 | 1.0 | | |
| Barium stearate | 0.5 | 0.5 | | | 0.5 | 0.5 | 0.5 | 0.5 | 0.5 | 0.5 | | |
| Zinc stearate | | | 0.5 | 0.5 | | | | | | | | |
| Dibutyltin maleate | | | | | | | | | | | 1.5 | |
| Dibutyltin bis(isooctyl thioglycolate) | | | | | | | | | | | | 1.5 |
| Trioctadecyl phosphite | | | | | | | | | | | | |
| 4,4'-Dihydroxydiphenyl | | | | | | | | | | | | |
| Properties | | | | | | | | | | | | |
| Cigarette resistance | O | O | O | O | O | O | O | O | O | O | O | O |
| Weatherability | Δ-O | O | Δ-O | O | O | O | O | Δ | Δ | Δ-O | O | O |
| Heat distortion temperature (°C.) | 65 | 67 | 67 | 65 | 67 | 55 | 68 | 68 | 68 | 60 | 68 | 68 |
| Tensile strength (23° C., kg/cm²) | 610 | 620 | 630 | 620 | 630 | 590 | 615 | 620 | 620 | 600 | 620 | 625 |
| Tensile strength (50° C., kg/cm²) | 430 | 450 | 450 | 450 | 440 | 400 | 440 | 440 | 440 | 430 | 450 | 440 |
| Elongation | 16 | 20 | 21 | 20 | 20 | 24 | 14 | 16 | 18 | 22 | 17 | 18 |
| Brabender torque stability | O | O | O | O | O | O | O | O | O | O | O | O |
| Discoloration of sheet after ultraviolet irradiation | Δ-O | O | Δ-O | O | O | O | Δ-O | Δ | Δ-O | Δ-O | O | O |
| Heat discoloration | Δ | O | Δ | O | O | O | Δ | X-Δ | Δ | Δ | O | O |

| | Examples | | | | | | | | Comparative Examples | | | |
|---|---|---|---|---|---|---|---|---|---|---|---|---|
| | 13 | 14 | 15 | 16 | 17 | 18 | 19 | 20 | 1 | 2 | 3 | 4 |
| Components (part by weight) | | | | | | | | | | | | |
| PVC ($\bar{P}$ = 1050)[1] | 100 | 100 | 100 | 100 | 100 | 100 | 100 | 100 | 100 | 100 | 100 | 100 |
| Ethylene-vinyl acetate copolymer[2] | | | | | | 10 | | | | | | |
| DOP | | | | | | | 10 | 10 | | 50 | 48 | |
| Reactive plasticizer | | | | | | | | | | | | |
| Trimethylolpropane mono-benzoate diacrylate | | | | | | | | | | | | |
| Trimethylolpropane mono-benzoate dimethacrylate | | | | | | | | | | | | |
| Bisacryloyl oxyethylene phthalate | | | | | | | | | | | | |
| Bismethacryloyl oxyethylene phthalate | | | | | | | | | | | | |

TABLE 1-continued

| Components (part by weight) | | | | | | | | | | | | |
|---|---|---|---|---|---|---|---|---|---|---|---|---|
| 2,2-Bis(4-methacryloxydiethoxyphenyl)propane | | | | | | | | 50 | | | | |
| Diallyl phthalate | | | | | | | | | | | | |
| Urethane acrylate[3] | | | | | | | | | | | | |
| Trimethylolpropane triacrylate | | | | | | 50 | 50 | | | | 50 | |
| Trimethylolpropane trimethacrylate | 50 | 50 | 50 | 50 | 50 | | | | 2 | | | |
| Neopentyl glycol dimethacrylate | | | | | | | | | | | | |
| Components (part by weight) | | | | | | | | | | | | |
| Photosensitizer | | | | | | | | | | | | |
| Benzoin isopropyl ether | 0.3 | 0.3 | 0.3 | 0.3 | 0.3 | 0.3 | 0.3 | 0.3 | | 0.01 | 0.3 | |
| Benzoin methyl ether | | | | | | | | | | | | |
| Polymerization inhibitor | | | | | | | | | | | | |
| Hydroquinone | 0.1 | 0.1 | 0.1 | 0.1 | 0.1 | 0.1 | 0.1 | 0.1 | | | | |
| t-Butylhydroquinone | | | | | | | | | | | | |
| Stabilizer | | | | | | | | | | | | |
| Cadmium stearate | 1.0 | 1.0 | 1.0 | | | 1.0 | 1.0 | | 1.0 | 1.0 | 1.0 | 1.0 |
| Barium stearate | 0.5 | 0.5 | 0.5 | | | 0.5 | 0.5 | | 0.5 | 0.5 | 0.5 | 0.5 |
| Zinc stearate | | | | | | | | | | | | |
| Dibutyltin maleate | | | | 1.5 | | | | | | | | |
| Dibutyltin bis(isooctyl thioglycolate) | | | | | 1.5 | | | 1.5 | | | | |
| Trioctadecyl phosphite | | 1.0 | 1.0 | 1.0 | 1.0 | | | 1.0 | | | | |
| 4,4'-Dihydroxydiphenyl | 1.0 | | 1.0 | 1.0 | 1.0 | | | 1.0 | | | | |
| Properties | | | | | | | | | | | | |
| Cigarette resistance | O | O | O | O | O | O | O | O | X | X | X | |
| Weatherability | Δ-O | Δ-O | O | O | O | Δ | Δ | O | Δ-O | O | O | |
| Heat distortion temperature (°C.) | 68 | 68 | 68 | 68 | 68 | 66 | 60 | 60 | 65 | <20 | <20 | Unmeasurable[4] |
| Tensile strength (23° C., kg/cm²) | 620 | 630 | 620 | 625 | 620 | 625 | 610 | 600 | 530 | 210 | 250 | |
| Tensile strength (50° C., kg/cm²) | 440 | 440 | 450 | 440 | 430 | 435 | 425 | 420 | 330 | 153 | 158 | |
| Elongation | 18 | 16 | 17 | 18 | 16 | 17 | 22 | 22 | 5 | 308 | 288 | |
| Brabender torque stability | O | O | O | O | O | O | O | O | O | O | O | X |
| Discoloration of sheet after ultraviolet irradiation | O | O | O | O | O | Δ | Δ-O | O | O | O | O | Δ |
| Heat discoloration | Δ-O | Δ-O | O | O | O | X-Δ | Δ | O | Δ-O | O | O | X-Δ |

Note:
[1]ZEON 103 EP, a product of Nippon Zeon Co., Ltd.
[2]EVATHLENE 410 (vinyl acetate content 60% by weight), a product of Dainippon Ink & Chemicals, Inc.
[3]Reaction product of 1,6-hexanediol (1 mole), xylylene diisocyanate (2 moles) and 2-hydroxyethyl methacrylate (2 moles)
[4]The mixture gelled during calendering, and a sheet-like composition having a uniform surface was not obtained.

The properties shown in Table 1 were measured by the following methods:

Cigarette resistance

A fresh cigarette (SEVEN STARS, a product of Japan Monopoly Corporation) was lit, and when it burned by a length of 20 mm from its front end, the cigarette was laid on the sample sheet with the fire maintained but after the ash was sufficiently removed. Immediately after laid thereon, the burning cigarette was ground with a shoe sole. Then, the sample sheet was observed for the surface condition, the degree of breakage, and the way the ash adhered.

The mark O means that the surface changed to yellow brown but the ash of the cigarette did not adhere.

The mark Δ means that the ash of the cigarette partially adhered.

The mark X means that the surface was considerably broken and the ash of the cigarette adhered onto the entire surface.

Weatherability

The sample sheet was exposed for 100 hours in a sunshine weatherometer, and then observed for discoloration.

The mark O means no discoloration.
The mark Δ means slight discoloration.
The mark X means marked discoloration.

Heat distortion temperature

It was measured in accordance with JIS K-6919.

Tensile strength and elongation

They were measured under the tensile conditions of 200 mm/minute at 23° C. and 50° C. using an Instron tester (No. 3 dumbbell).

Brabender torque stability

The uncrosslinked PVC composition was charged in an amount of 60 parts into a Brabender Plasti-Corder, which was rotated at 60 rpm with the jacket temperature maintained at 190° C. to observe whether or not the torque increased during a period of 15 minutes.

O No increase in torque (stable).
Δ Increase in torque sometimes observed (unstable).
X Torque increased (gelled).

After irradiation with ultraviolet rays, the sample sheet was observed for color.
O Color did not change.
Δ Color slightly changed.
X Color changed radically.

Heat discoloration

The sample sheet after ultraviolet irradiation was heated in a Geer oven at 180° C., and 10 minutes later, it was observed for color.

○ Color did not change.
△ Color changed slightly.
X Color changed considerably.

EXAMPLE 21

PVC sol was coated to a thickness of 0.5 mm on an asbestos sheet having a thickness of 1.0 mm, and half-gelled at 120° C., followed by imprinting thereon a print pattern. The ultraviolet-irradiated sheet obtained in Example 1 was press-bonded onto the resulting product at 150° C. for 30 minutes to obtain a decorative flooring.

The resulting decorative flooring was tested for cigarette resistance, with the result that its surface changed somewhat to yellow but was not broken, and had no adhesion of the ash of the cigarette.

EXAMPLE 22

A sheet having a thickness of 0.2 mm was obtained from each of the blends A and B shown in Table 2 below by repeating the procedure of Example 1. Separately, PVC sol was coated to a thickness of 0.5 mm on a flame-retarding kraft paper by means of a roll coater, and passed through a hot-air oven at 200° C. for 2 minutes for gelation, followed by imprinting thereon a print pattern. Onto the resulting product was welded said sheet at 150° C. for 20 minutes to obtain a wall paper. Test was made for the pencil hardness of the wall paper, and the results shown in Table 2 were obtained.

TABLE 2

|  | Blend A | Blend B |
| --- | --- | --- |
| PVC ($\bar{P}$ = 1050) | 100 parts | 100 parts |
| Trimethylolpropane triacrylate | 50 | — |
| 1,6-Hexanediol diacrylate | — | 50 |
| Benzoin isopropyl ether | 0.5 | 0.5 |
| t-Butylhydroquinone | 0.5 | 0.5 |
| Dibutyltin maleate | 1.5 | 1.5 |
| Pencil hardness of wall paper | 3H | 2H |

EXAMPLE 23

A sheet having a thickness of 0.1 mm was obtained from each of the blends A and B shown in Table 3 by performing the procedure of Example 1. Separately, a blowing agent-containing PVC sheet having a thickness of 0.3 mm was laminated at 170° C. on a cotton cloth by means of an inverted L calender. Onto the laminate was further laminated said sheet, and the resulting product was passed through a hot-air oven at 200° C. for 2 minutes to obtain a sponge leather.

The leather was tested for pencil hardness, with the results shown in Table 3.

TABLE 3

|  | Blend A | Blend B |
| --- | --- | --- |
| PVC ($\bar{P}$ = 1050) | 100 parts | 100 parts |
| Trimethylolpropane trimethacrylate | 50 | — |
| 1,3-Butylene glycol dimethacrylate | — | 50 |
| Benzoin ethyl ether | 0.5 | 0.5 |
| Hydroquinone | 0.5 | 0.5 |

TABLE 3-continued

|  | Blend A | Blend B |
| --- | --- | --- |
| Dibutyltin maleate | 1.5 | 1.5 |
| Pencil hardness of leather | 3H | 2H |

EXAMPLE 24

The same procedure as in Example 1 was performed to obtain a sheet from each of the blends A and B shown in Table 4. Separately, a vinyl acetate resin emulsion was used as an adhesive in bonding a sheet with a print pattern onto a plywood having a thickness of 5.5 mm. Said sheet was hot-pressed against the laminate for 20 minutes at a temperature of 150° C. under a pressure of 10 kg/cm² to afford a decorative sheet (plywood).

The cigarette resistance and pencil hardness of the decorative sheet was measured. The results are shown in Table 4.

TABLE 4

|  | Blend A | Blend B |
| --- | --- | --- |
| PVC ($\bar{P}$ = 1050) | 100 parts | 100 parts |
| Pentaerythritol tetraacrylate | 50 | — |
| 1,5-Pentanediol diacrylate | — | 50 |
| Benzoin ethyl ether | 0.5 | 0.5 |
| t-Butylhydroquinone | 0.5 | 0.5 |
| Dioctyltin laurate | 1.5 | 1.5 |
| Cigarette resistance of decorative sheet | ○ | ○ |
| Pencil hardness of decorative sheet | 4H | 3H |

EXAMPLE 25

The sheet of Example 1 having a print pattern on the surface was contact-bonded by a roll at 180° C. to a 0.3 mm-thick steel sheet having a dry coating of a nitrile rubber type adhesive. Thereby was obtained a PVC steel sheet. The surface hardness of the resulting steel sheet was 3H in pencil hardness.

What is claimed is:

1. A process for preparing a sheet-like article of polyvinyl chloride, which comprises calendering a composition comprising polyvinyl chloride, a reactive plasticizer, a photosensitzer, a stabilizer and a polymerization inhibitor under heat without causing the reaction of the reactive plasticizer, and then irradiating the product with ultraviolet rays to cause the reaction of the reactive plasticizer.

2. A process as claimed in claim 1, wherein the calendering is carried out with heating at 130° to 200° C.

3. A process as claimed in claim 1, wherein the calendering is carried out at a speed of 20 to 200 m/minute.

4. The process according to claim 1 wherein the polyvinyl chloride is a vinyl chloride homopolymer and the reactive plasticizer is selected from the group consisting of (i) polyfunctional monomers obtained from methacrylic acid and aliphatic polyhydric alcohol, and
(ii) polyfunctional methacrylic oligomers expressed by the formula (I), (II), (III) or (IV):

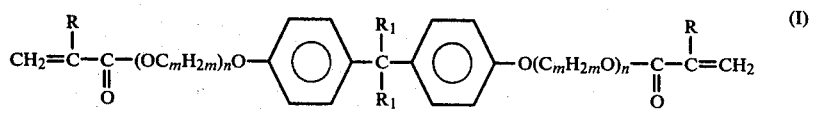

wherein R represents methyl group and $R_1$ represents hydrogen atom or methyl group, and m and n denote an integer of 2 to 4 and an integer of 1 to 10, respectively;

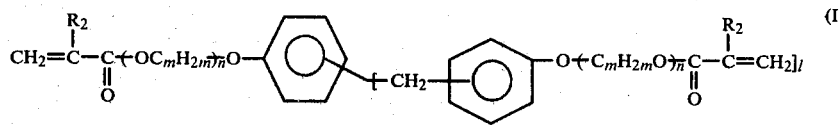

wherein $R_2$ represents methyl group, m is an integer of 2 to 4, n is an integer of 1 to 10, and l is an integer of 0 to 20;

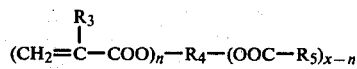

wherein $R_3$ is methyl group; $R_4$ is an alcohol residue having 2 to 10 carbon atoms and a valence of at least 2, or a polyether polyol residue formed by the addition of an alkylene oxide having 2 to 4 carbon atoms to said alcohol; $R_5$ is a phenyl group substituted with an alkyl group having 1 to 10 carbon atoms, or an unsubstituted phenyl group; n is a number ranging from 0.1 to 5.9 on the average; and x is an integer of at least 2, x-n being always greater than 1; or

wherein $R_6$ represents methyl group, $R_7$ represents an alkylene group, having 2 to 10 carbon atoms, n is an integer of 1 to 10 and Ar denotes a divalent aromatic group.

5. A process as claimed in claim 1 wherein the composition consists essentially of polyvinyl chloride, 3 to 70% by weight of the reactive plasticizer, based on the weight of the polyvinyl chloride, 0.001 to 10% by weight of the photosensitizer, based on the weight of the reactive plasticizer, 0.05 to 5% by weight of the stabilizer, based on the weight of the polyvinyl chloride, and 0.01 to 10% by weight of the polymerization inhibitor, based on the weight of the reactive plasticizer.

* * * * *